April 8, 1958 M. J. E. GOLAY 2,829,460

ETCHING METHOD AND ETCHING PLATE

Filed Dec. 22, 1953

INVENTOR Marcel J. E. Golay

United States Patent Office 2,829,460

Patented Apr. 8, 1958

2,829,460

ETCHING METHOD AND ETCHING PLATE

Marcel J. E. Golay, Rumson, N. J.

Application December 22, 1953, Serial No. 399,698

3 Claims. (Cl. 41—46)

Figure 1:
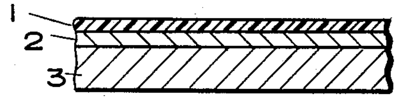

This invention concerns a novel etching technique which embraces and utilizes a novel etching plate. The etching plate employed constitutes a base metal plate on which at least one thin metallic layer of different chemical composition is deposited; a conventional "resist" is coated over the thin metallic layer. In use, the resist is processed by conventional techniques so that it is removed from the etching plate in the desired image or stencil. A first etching solution is then employed which will etch away the thin metallic layer through the stencil formed by the resist, without attacking the base metal of the plate. Thereafter, a second etching solution is used which will etch away the base metal plate at the exposed portions without affecting the thin metallic layer. Etching of the base metal is carried out so as to undercut the thin metallic layer so that in subsequent use as a reticle, as a press plate, etc., the sharply etched thin metallic layer controls the configuration while the base metal sheet provides essential strength to the structure.

This invention broadly concerns the production of stencils of the character employed in photolithography and similar applications. The basic method employed for making such stencils involves coating a metal plate with a light sensitive layer. After exposure, the coating is dissolved away where not sensitized by the light. An "etching" solution may then be applied to the exposed portions of the plate so as to treat these portions of the plate as desired. There have been many suggestions for the refinement and modification of this basic technique intended to improve the character of the stencil which may be obtained. Particular problems concern the tendency for an etching solution to undercut the coating, reducing the sharpness of the stencil and the dimensional accuracy of configuration. Again, when desired to secure a stencil having distinct relief areas, or even complete perforations, the technique identified is inadequate. The present invention is directed to a solution of these problems, providing a simple and effective manner for securing sharp and accurately defined stencils.

It is the principal object of this invention to provide an etching technique which will produce etched patterns of remarkable "sharpness." This is achieved by preventing undercutting of the resist employed so that a sharply etched pattern is obtained, faithfully corresponding to the pattern of the resist.

It is a specific object of this invention to provide an etching technique which can be used for producing apertures of remarkable "definition" in a thin metallic sheet for use as reticles and the like. This is achieved by use of a bimetallic etching plate in which a very thin metal layer is perforated by etching in a manner permitting a base plate to provide essential strength to the perforated metal layer.

Figure 3:
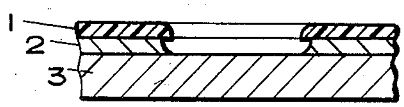
Figure 4:
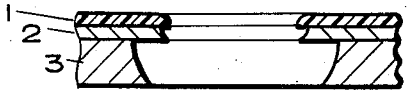
Figure 5:
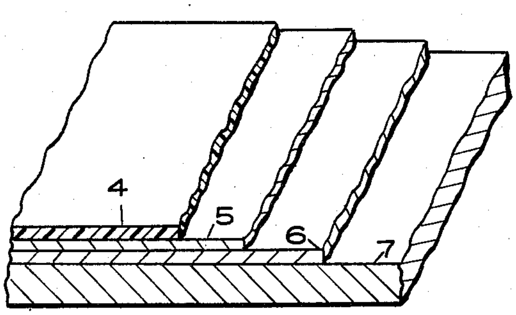

The invention will be described with particular reference to the production of perforated stencils. In this application, the invention can be used to provide fine, clear perforations in a metal plate primarily of application for optical instruments. The principles of the invention are illustrated in the accompanying drawing in which:

Figures 1, 2, 3, and 4 diagrammatically illustrate, in cross-sectional view, a bimetallic etching plate embodying the invention in sequential stages of processing, and, Figure 5 illustrates a modification of the invention employing a tri-metallic etching plate shown in perspective, partly in section.

The nature of the etching plate of this invention can be fully appreciated by reference to Figure 1. A basic metal sheet 3 is employed selected to provide the desired strength and rigidity to the stencil. While subject to certain limitations, as noted hereafter, the basic metal sheet may be of substantial thickness and can be chosen from a wide variety of metals. A thin metal layer 2 is coated or bonded to the basic metal sheet. In general, this layer has a thickness of about 1 to 5 ten-thousandths of an inch. Again, metal layer 2 may be chosen from a wide variety of metals, with the all important qualification that it differ from metal sheet 3 in etching characteristics; namely metals 2 and 3 must be subject to selective attack by different etching solutions. Finally, a light sensitive coating 1 or "resist" of conventional nature is applied over the metal layer 2 so as to firmly bond to the metal.

As indicated, it is essential that metals 2 and 3 be chosen so that each may be selectively etched by a suitable etching solution which will not attack the other. In actuality, however, this primarily necessitates use of metals of different chemical composition since it is generally practical to make up etching solutions which will attack and dissolve away one metal while not substantially eroding the other metal. "Attack" as used in this sense is employed to identify actual dissolution of one metal although this does not necessarily require that there be no chemical reaction with the other metal. Thus, for example, an etching solution may react with one metal to form soluble metal salts resulting in the dissolution of this metal while reacting with another metal only to the extent of forming insoluble metal salts resulting in forming a protective coating on this metal. In view of these considerations, the metal sheet 3 and metal layer 2 may be fabricated of virtually any different metals, chosen primarily with reference to the physical properties of these metals. In this connection, for example, it may be desirable to choose either a flexible or inflexible metal for the base sheet 3 depending on the use of the stencil to be made. Again, it is ordinarily preferred to use metals which possess the properties of strength and smoothness in thin layers.

Thin metal layer 2 may be coated on or bonded to the base metal sheet 3 in any desired manner. While physical bonding can be successfully employed, it is generally preferable to employ electro chemical deposition or electroplating to form the bimetallic layers. The base sheet 3 can ordinarily be chosen from commercially available sheet stocks and the metal layer 2 can then be plated on the base sheet.

As stated, the resist 1 may be chosen from any of the conventional compositions. For example, the resist may constitute a light sensitive bitumen or "asphaltum." Again the resist may constitute the more frequently used gum or colloid materials including light-sensitive chromium salts such as sodium, potassium or ammonium chromates and dichromates. Albumen may be used as the colloid. A suitable resist of this nature is coated on the thin metal layer 2 in the conventional manner.

Figure 2:
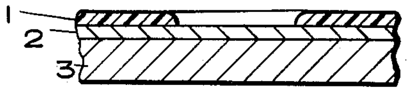

In using the etching plate described, the following procedural steps are carried out. First the light-sensitive coating is exposed to light under a photographic negative or under any stencil-like unit which selectively absorbs or transmits light. After exposure, water or any other suitable developing medium is used to redissolve the coating wherever it is unexposed. This leaves an image on the bimetallic layer of hardened, insoluble material which reproduces, reversed laterally and in value, the negative or stencil under which the exposure was made. At this stage, the etching plate will appear as illustrated in Figure 2 showing removal of a portion of the coating 1 as a result of light exposure and development.

In the next step of the process, a first etching solution is applied to the etching plate which will selectively attack the thin metal layer 2. For this purpose, the etching plate may be bathed in the etching solution or this solution may be washed over the plate or simply coated on the plate. Exposure of the etching plate should be terminated as soon as the exposed metal layer 2 is dissolved away, in turn exposing sections of the base sheet 3. Prompt termination of the first etching step helps prevent undercutting of the resist although this is not ordinarily encountered due to the thinness of the space between the resist 1 and the base metal 3. Again lateral etching of the thin layer 2 is essentially unappreciable since this would only extend to about the thickness of layer 2 even at very long etching exposure. After this step of the process, the etching plate will appear as illustrated in Figure 3.

Finally in the last step of the process, a second etching solution is applied to the etching plate so as to attack the base metal 3 when exposed by the prior step of the process. This etching solution will not attack the layer 2 so that it is only necessary to carry out this step of the process sufficiently long to etch away the base metal completely below the formerly etched perforation in layer 2. Some undercutting of layer 2 will result as shown in Figure 4 on an exaggerated scale, but this is not objectionable.

To all intents, the perforated stencil will now be complete. However, at this stage, or at any time after the first etching step, the coating 1 may be removed, if desired. Again, for example, protective coatings may be applied to the stencil or it may be mounted in glass, etc., as desired for use.

To illustrate a specific embodiment of this invention, an etching plate was prepared by electroplating a thin layer of silver on a brass foil. A dichromate-colloid resist was coated on the silver and the etching plate was exposed to light under a stencil including finely marked lines. The resist was developed to wash away unexposed portions and the plate was then etched with "Farmer's reducer." This solution etched away the exposed silver without affecting the underlying brass. Finally, a ferric chloride solution was applied to the etching plate so as to completely etch away the brass immediately below the perforations of the silver layer. It was found that the completed stencil was extremely sharp.

For best results in the practice of this invention, it is desirable to limit the thickness of the base metal sheet 3. This is dictated by the consideration that the thicker this plate, the greater the undercutting of the thin metal layer 2 in the final etching step of the process. If this undercutting becomes excessive, the advantage of strengthening the thin metal plate is obviated. In general, it is desirable that the base sheet 3 be no thicker than about ⅓ the diameter of perforations to be etched in the plate.

It is apparent that this invention is subject to many modifications and refinements. For example, if a relief etching is desired in place of a perforated stencil, a suitable backing plate or sheet may be fixed to the metal sheet 3 at any stage of the process. Again, while the invention has been described with reference to a bimetallic plate, it is sometimes desirable to employ three or more metal layers. Thus, for example, if the etching solutions referred to in the specific embodiment of the invention are used with silver plated bronze, it is found that Farmer's reducer reacts with the bronze so as to prevent sharp etching of the silver layer. This can be overcome by using a trimetallic etching plate as illustrated in Figure 5. In this Figure, a base sheet 7 of bronze can be employed. A layer of brass 6 can be electroplated on the bronze and a layer of silver 5 can be plated on the brass. A resist 4 is then coated on the silver. With this etching plate, Farmer's reducer can be used for etching the silver without attacking the underlying brass and bronze. Thereafter a ferric chloride solution may be used to etch away the brass and bronze beneath the perforations of the silver. It will be observed that in this case, a third metal layer is interposed between two other metals in order to better control selective etching of one of the layers. This concept further extends the choice of metals and etching solutions available for the practice of this invention.

What is claimed is:

1. A stencil comprising a base member formed of at least one material and having at least one opening extending therethrough and an exceedingly thin layer of another material overlying and bonded to said base member and having an opening aligned with the opening in said base member, said base member being undercut to form an opening slightly larger than the opening in said layer at its interface and not smaller than said layer opening at the other face for supporting the edges of said layer opening with the layer opening defining the area and configuration of the stencil opening.

2. A stencil according to claim 1 wherein said base member comprises at least two layers of different materials bonded one to the other, the last said materials differing from the material of said exceedingly thin layer.

3. The method of making an etched plate of composite structure comprising the steps of bonding a layer of metal to a base material and having different chemical characteristics than the deposited metal, applying a coating of resist material to said deposited layer, removing a predetermined area of said resist material to expose a part of said deposited layer, etching the exposed area of said deposited layer with a first etching agent to expose the base material, etching the exposed portion of the base material with at least one etching agent differing from the first agent to etch the base material without affecting said deposited layer and provide an undercut opening through the base material with the opening in said deposited layer defining the area of said opening through the composite structure.

References Cited in the file of this patent

UNITED STATES PATENTS

| | | |
|---|---|---|
| 1,311,275 | Harrison | July 29, 1919 |
| 2,257,143 | Wood | Sept. 30, 1941 |
| 2,282,203 | Norris | May 5, 1942 |
| 2,291,854 | Whyzmuzis | Aug. 4, 1942 |
| 2,332,003 | New | Oct. 19, 1943 |
| 2,338,091 | Brennan et al. | Jan. 4, 1944 |
| 2,395,448 | Brennan et al. | Feb. 26, 1944 |
| 2,421,607 | Fowler | June 3, 1947 |
| 2,569,752 | Fowler | Oct. 2, 1951 |
| 2,647,864 | Goffreddo | Aug. 4, 1953 |

FOREIGN PATENTS

| | | |
|---|---|---|
| 1,036,925 | France | Apr. 29, 1953 |